June 28, 1966 M. M. A. A. G. VERSTRAELEN 3,258,609

CIRCUIT FOR CONVERTING A SINUSOIDAL VOLTAGE TO A VOLTAGE HAVING A NON-SINUSOIDAL CYCLIC WAVEFORM

Filed July 31, 1963

INVENTOR.
MARIE M.A.A.GH. VERSTRAELEN
BY
[signature]
AGENT 3,258,609

CIRCUIT FOR CONVERTING A SINUSOIDAL VOLTAGE TO A VOLTAGE HAVING A NON-SINUSOIDAL CYCLIC WAVEFORM

Marie Marcel Antoine Arnold Ghislain Verstraelen, Hilversum, Netherlands, assignor to North American Philips Company, Inc., New York, N.Y., a corporation of Delaware Filed July 31, 1963, Ser. No. 298,907
Claims priority, application Netherlands, Sept. 6, 1962, 282,965
9 Claims. (Cl. 307—88.5)

The invention relates to a circuit for converting a substantially sinusoidal alternating voltage into a voltage having a non-sinusoidal cyclic waveform, more particularly into a pulse train. Such an arrangement may be used, for example, for controlling or synchronizing purposes. In the past this result has been achieved by supplying the alternating voltage to a non-linear element, for example to an amplifier stage biased for class C operation, through which current will only flow during the peaks of the alternating voltage.

Generally it is desirable for the amplitude of the pulses to be substantially independent of the amplitude and the frequency of the input alternating voltage as well as the supply voltage and the amplifier elements used. If the amplifier elements are transistors, this requirement is difficult to satisfy.

It is an object of the invention to provide an arrangement of the above mentioned kind by which these requirements are simply satisfied. According to the invention, the alternating voltage is applied through an amplifier to the series combination of a capacitor and a rectifier, so that the rectifier is alternately rendered conductive and non-conductive by the alternating voltage. A negative-feedback voltage for the amplifier is derived from this series combination. The alternating voltage is preferably applied to the base of a first transistor which together with a second transistor forms a known two-stage amplifier. The collector of the first transistor is connected for direct current to the base of the second transistor and the emitter of the second transistor is connected for direct current to the base of the first transistor. The series combination of the capacitor and the rectifier is connected in the emitter path of the second transistor.

Figure 1:
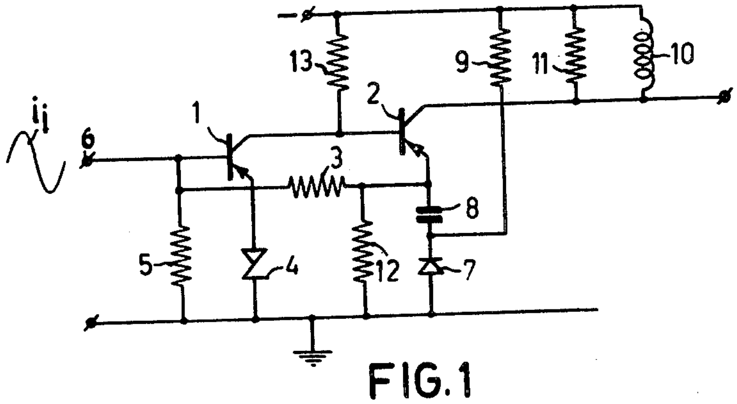
Figure 2:
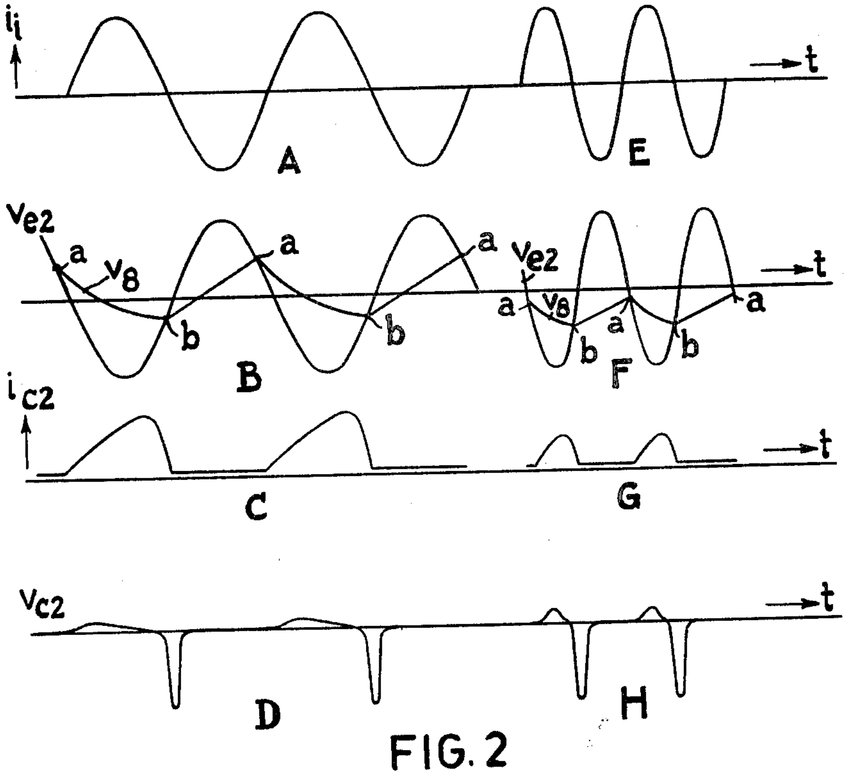

In order that the invention may be more readily understood, an embodiment thereof will now be described, by way of example, with reference to the accompanying diagrammatic drawing, in which:

FIGURE 1 shows an embodiment of an arrangement in accordance with the invention; and FIGURE 2 shows voltage and current waveforms illustrating the operation of the embodiment shown in FIGURE 1.

The arrangement shown in FIGURE 1 includes a first transistor 1 and a second transistor 2, which are connected in the conventional manner to form a two-stage amplifier. The collector of the transistor 1 is connected for direct current to the base of the transistor 2 and the emitter of the transistor 2 is connected for direct current to the base of the transistor 1. Such an amplifier has the property of being substantially insensitive to variations in the supply and the temperature, since the direct-current negative-feedback of the emitter of the transistor 2 through a coupling resistor 3 to the base of the transistor 1 provides the required operating point stabilisation. A zener diode 4 is included in the emitter circuit of the transistor 1 to enable the required voltage drop across a base resistor 5 of the first transistor 1 to be produced, so that resistor 5 may have a fairly high value. Resistors 12 and 13 provides the correct direct-current adjustment for the transistor 2. The diode 4 may, if desired, be replaced by a semiconductor diode having a sufficiently high internal threshold voltage and operated in the forward direction or by resistors, which may be shunted by capacitors, to the positive and negative terminals of the supply source.

A substantially sinusoidal alternating current $i_1$ delivered by a source of comparatively high internal resistance is applied to the base of the transistor 1. This alternating current may be obtained, for example, from an oscillator having satisfactory frequency stability, however, this oscillator and/or the succeeding amplifying stages may obviously introduce a certain degree of distortion. The proportion of distortion components, however, is small in relation to the fundamental wave of the alternating voltage applied to the terminal 6. In FIGURE 2A this current $i_1$ is shown as a function of time $t$.

According to the invention the series combination of a rectifier 7 and a capacitor 8 is connected in the emitter circuit of the transistor 2. If desired, the circuit elements 7 and 8 may be interchanged. The rectifier 7 is poled to conduct current in the same direction as the emitter-base diode of the transistor 2. With the aid of a resistor 9, the rectifier 7 is provided with a small forward bias. Resistor 9 also plays an important part in the charging and discharging processes of capacitor 8. The desired pulse train is produced across an output inductance 10 which may, if desired, be shunted by a resistor 11.

The circuit of the invention operates as follows:

During the positive phase of the substantialyy sinusoidal input alternating current $i_1$, the voltage at the base of the transistor 2 is in its negative phase. The voltage $v_{e2}$ at the emitter of the transistor 2 follows this base voltage and is shown in FIGURE 2B as a function of time. (If the resistor 3 is large with respect to the impedance of the circuit elements 7, 8 and 9 and if the product of the negative feedback factor and the amplification factor of the amplifier 1, 2 is large as compared to unity, the negative feedback current flowing through the resistor 3 will be substantially equal to the input alternating current $i_1$ and hence will also have a substantially sinusoidal variation. Consequently the voltage $v_{e2}$ may also be assumed to be substantially sinusoidal.) During this phase the rectifier 7 becomes conductive, since the conductive direction of this rectifier is the same as that of the emitter of the transistor 2. As a result the negative feedback, which is produced at the base of the transistor 1 by the series circuit 7, 8 in the emitter circuit of the transistor 2 and/or through the resistor 3 decreases greatly. Consequently, the collector current $i_{c2}$ (FIGURE 2C) through transistor 2 greatly increases. A charging current is simultaneously supplied to the capacitor 8 so that the voltage $v_8$ across this capacitor has the variation shown in FIGURE 2B. The charging time constant is approximately determined by the capacitance value of the capacitor 8 and the internal resistance of the rectifier 7 and is such that the rectifier 7 together with the capacitor 8 acts as a peak voltage detector of low efficiency.

During the negative phase of the input current $i_1$ the voltage $v_{e2}$ is in the positive phase and hence the rectifier 7 is cut off and the collector current $i_{c2}$ is reduced to a small value due to the negative-feedback action through the resistor 3. (Consequently, the transistor 2 does not become completely non-conductive, which improves its behaviour at high frequencies.) At the same time the capacitor 8 is charged from the supply source through the resistors 3, 5 and 9 in a sense opposite to that mentioned herein before, the discharge time constant being appreciably greater than the above-mentioned charging time constant. The current which in this process flows through the resistor 9 to the capacitor 8, is so large that the voltage at the junction of the capacitor 8 and rectifier 7 becomes positive. Due to the fact that the rectifier 7 is abruptly rendered nonconductive by the alternating voltage $v_{e2}$ the collector current $i_{c2}$ also varies abruptly, so that it may be assumed that the time required for rendering it inoperative is very short. By differentiation of this current variation with the aid of the inductance 10 the pulse voltages $v_{c2}$ shown in FIGURE 2D are produced.

The instants at which the rectifier 7 is rendered conductive and nonconductive are designated by *a* and *b* in FIGURE 2B respectively; they occur at the points of intersection of the capacitor voltage $v_8$ and the emitter voltage $v_{e2}$ of the transistor 2. With increase in the frequency of the input oscillations $i_1$ the situation is altered in the manner shown in FIGURES 2E–2H. The discharge time constant of the capacitor 8 (which corresponds to the slope of the portions *b–a* of the curve representing the voltage $v_8$ in FIGURE 2F) has remained substantially the same as in FIGURE 2B, but the charging of the capacitor 8 now is effected at a greater speed (portion *a–b* of the curve representing the voltage $v_8$ in FIGURE 2F), since with respect to the charging process the rectifier 7 together with the capacitor 8 due to the small charging time constant increasingly acquires the nature of an ideal peak-voltage detector. With proper proportioning the curve $v_8$ intersects the sinusoid $v_{e2}$ in the point *b* in FIGURE 2F, where the slope of this sinusoid is substantially the same as that at the point *b* of FIGURE 2B. This slope substantially determines the amplitude of the output voltage pulses $v_{c2}$, so that with this proportioning the output amplitude substanially does no vary any longer with the frequency.

In a practical embodiment the circuit elements used had the following values.

Transistors:
- 1=AFZ12
- 2=AF118

Diodes:
- 4=OAZ202 (6 v.)
- 7=FD100

Resistors:
- 3=1500 ohms
- 5=1000 ohms
- 9=1500 ohms
- 11=330 ohms
- 12=1000 ohms
- 13=2700 ohms Capacitor: 8=0.1 μf.
Inductance: 10=1 μh.
Supply voltage=24 v.
Input alternating current=from 1 to 2 ma.
Frequency range=from 0.5 to 25 mc./s., Output pulses 6 v., the variation of these pulses is smaller than 2 db over this frequency range.

Obviously the principle set forth may also be used in a multistage amplifier provided with negative feedback. The two-stage amplifier described, however, has the important advantages of satisfactory working-point stabilisation and slight tendency to self-oscillate. Alternatively tube amplifiers may in principle be used instead of transistor amplifiers.

What is claimed is:

1. A circuit for converting a substantially sinusoidal alternating voltage to a cyclic voltage of non-sinusoidal wave shape, comprising a source of said alternating voltage, an amplifier having an input circuit and an output circuit, means applying said alternating voltage to said input circuit, a series circuit of a capacitor and rectifier means, a point of reference potential connected to one end of said series circuit, means for applying said alternating voltage to the other end of said series circuit by way of said amplifier whereby said rectifier is conductive during only part of each cycle of said alternating voltage for charging said capacitor in one sense, means for charging said capacitor in the oppostie sense during the remainder of each cycle, means deriving a negative feedback voltage from said other end of said series circuit, means applying said negative feedback voltage to the input circuit of said amplifier, and means for deriving said cyclic voltage from said output circuit.

2. A circuit for producing a cyclic non-sinusoidal voltage comprising a source of a substantially sinusoidal alternating voltage, an amplifier device having input, output and common electrodes, means for applying said alternating voltage to said input electrode, a series circuit of a capacitor and rectifier means connected between said common electrode and a point of reference potential, said rectifier means being poled in the conduction direction of said device, whereby said capacitor is charged in one sense during at least part of the excursion of said alternating voltage in one direction, means connected to said capacitor for charging said capacitor in the opposite sense during at least part of the excursions of said alternating voltage in the opposite direction, and differentiating output circuit means connected to said output electrode, the charging and discharging time constants of said capacitor being proportioned so that the amplitude of voltage across said output circuit means is substantially independent of the frequency of said alternating voltage.

3. A circuit for producing a cyclic non-sinusoidal voltage comprising a source of a substantially sinusoidal alternating voltage, an amplifier device having input, output and common electrodes, means for applying said alternating voltage to said input electrode, a series circuit of a capacitor and rectifier means connected between said common electrode and a point of reference potential, said rectifier means being poled in the conduction direction of said device, whereby said capacitor is charged in one sense during at least part of the excursions of said alternating voltage in one direction, a source of direct potential having one terminal connected to said point of reference potential, resistor means connecting said capacitor to the other terminal of said source of direct potential for charging said capacitor in the opposite sense, the time constant of charging said capacitor in said opposite sense being greater than the time constant of charging in said one sense, and differentiating output circuit means connected to said output electrode, said time constants being proportioned so that the amplitude of voltage across said output circuit means is substantially independent of the frequency of said alternating voltage.

4. A circuit for producing a pulse train from a substantially sinusoidal alternating voltage comprising a source of said alternating voltage, first and second transistors each having base, emitter and collector electrodes, means applying said alternating voltage to the base of said first transistor, a direct current connection between the base of said second transistor and the collector of said first transistor, a direct current connection between the emitter of said second transistor and the base of said first transistor comprising negative feedback resistor means, a series circuit of a capacitor and rectifier means connected between the emitter of said second transistor and a point of reference potential, said rectifier means being poled in the direction of emitter current flow of said second transistor whereby said rectifier means is conductive during only part of each cycle of said alternating voltage for charging said capacitor in one sense, means for charging said capacitor in the opposite sense during the remainder of each cycle, and output circuit means connected to said collector electrode of said second transistor.

5. A circuit for producing a pulse train from a substantially sinusoidal alternating voltage comprising a source of said alternating voltage, first and second transistors each having base, emitter and collector electrodes, means applying said alternating voltage to the base of said first transistor, a direct current connection between the base of said second transistor and the collector of said first transistor, negative feedback resistor means connected between the emitter of said second transistor and the base of said first transistor, a series circuit of a capacitor and rectifier means connected between the emitter of said second transistor and a point of reference potential, means for connecting the base of said first transistor to said point, said rectifier being poled in the direction of emitter current flow of said second transistor whereby said rectifier means is conductive during only part of each cycle of said alternating voltage for charging said capacitor in one sense, a source of direct voltage, means for connecting said source of direct voltage between said point of reference potential and the junction of said capacitor and rectifier means for charging said capacitor in the opposite sense, the time constant of charging of said capacitor in said opposite sense being greater than the time constant of charging in said one sense, and differentiating output circuit means connected to the collector of said second transistor.

6. The circuit of claim 5, in which said means connecting said base of said first transistor to said point of reference potential is a first resistor, one terminal of said capacitor is connected to the emitter of said second transistor, and said means for connecting said source of direct voltage to said junction is a second resistor.

7. The circuit of claim 8, in which the charging time constants of said capacitor in said one and opposite senses are relatively proportioned such that the intercept of the waveform of the voltage applied to said series circuit and the waveform of the voltage across said capacitor is at a point of slope on said waveform of voltage applied to said series circuit that is independent of the frequency of said alternating voltage.

8. The circuit of claim 5, in which the charging time constant of said capacitor in said one and opposite senses are relatively proportioned so that the amplitude of voltage across said output circuit is substantially independent of the frequency of said alternating voltage.

9. A circuit for converting a substantially sinusoidal alternating voltage to a pulse train comprising a source of said alternating voltage, an amplifier comprising a plurality of amplifier stages including a first amplifier stage and a last amplifier stage, means applying said alternating voltage to said first amplifier stage, said last amplifier stage comprising an amplifier device having input, common and output electrodes, and means applying the output of the next preceding amplifier stage to said input electrode, negative feedback means connected between said common electrode and the input of said amplifier whereby the wave shape of voltage at said common electrode is substantially sinusoidal, a source of operating potential having first and second terminals, the series circuit of a capacitor and a rectifier connected between said common electrode and said first terminal whereby said rectifier is rendered conductive for only part of each cycle of said alternating voltage for charging said capacitor in a first sense, resistor means connected between said second terminal and the junction of said capacitor and rectifier for charging said capacitor in the opposite sense during the remainder of each cycle of said alternating voltage, and differentiating output circuit means connected to said output electrode.

References Cited by the Examiner

UNITED STATES PATENTS

| | | | |
|---|---|---|---|
| 3,036,224 | 5/1962 | Abraham | 307—88.5 |
| 3,060,326 | 10/1962 | Watson | 307—88.5 |
| 3,144,613 | 8/1964 | Pugerud | 328—172 |
| 3,162,818 | 12/1964 | Murphy | 328—169 |

ARTHUR GAUSS, *Primary Examiner.*

S. D. MILLER, *Assistant Examiner.*